United States Patent [19]

Lo

[11] Patent Number: 5,617,436

[45] Date of Patent: Apr. 1, 1997

[54] STRAIN-COMPENSATED MULTIPLE QUANTUM WELL LASER STRUCTURES

[75] Inventor: Yu-Hwa Lo, Ithaca, N.Y.

[73] Assignee: Cornell Research Foundation, Inc., Ithaca, N.Y.

[21] Appl. No.: 486,046

[22] Filed: Jun. 7, 1995

[51] Int. Cl.$^6$ .............................. H01S 3/18; H01S 3/085
[52] U.S. Cl. ................. 372/45; 372/96; 372/92; 372/102
[58] Field of Search .............................. 372/45, 96, 102, 372/92; 257/18

[56] References Cited

U.S. PATENT DOCUMENTS

| 4,800,100 | 1/1989 | Herbots et al. | 427/28 |
|---|---|---|---|
| 4,815,083 | 3/1989 | Sugou et al. | 372/46 |
| 4,826,282 | 5/1989 | Alferness | 372/50 |
| 4,881,235 | 11/1989 | Chinone et al. | 372/45 |
| 5,034,958 | 7/1991 | Kwon et al. | 372/96 |
| 5,070,509 | 12/1991 | Meyers | 372/50 |
| 5,103,456 | 4/1992 | Scifres et al. | 372/50 |
| 5,131,001 | 7/1992 | Carlson | 372/50 |
| 5,159,603 | 10/1992 | Kim | 372/45 |
| 5,164,949 | 11/1992 | Ackley et al. | 372/45 |
| 5,164,956 | 11/1992 | Lang | 372/96 |
| 5,181,086 | 1/1993 | Yoshida | 372/45 |
| 5,204,870 | 4/1993 | Faist et al. | 372/45 |
| 5,212,702 | 5/1993 | Choquette | 372/45 |
| 5,251,225 | 10/1993 | Eglash et al. | 372/45 |
| 5,255,278 | 10/1993 | Yamanaka | 372/96 |
| 5,337,328 | 8/1994 | Lang et al. | 372/96 |
| 5,363,392 | 11/1994 | Kasukawa et al. | 372/45 |
| 5,373,166 | 12/1994 | Buchan et al. | 257/18 |
| 5,392,306 | 2/1995 | Usami et al. | 372/45 |
| 5,448,581 | 9/1995 | Wu et al. | 372/45 |
| 5,452,318 | 9/1995 | Makino et al. | 372/96 |

FOREIGN PATENT DOCUMENTS

| 63-60585 | 3/1988 | Japan | 372/96 |
|---|---|---|---|
| 63-150981 | 6/1988 | Japan | 372/96 |

OTHER PUBLICATIONS

Chua, C. L. et al., "Long wavelength vertical cavity laser using strain–compensated multiple quantum wells on GaAs substrates", LEOS 1994 Proceedings, Oct. 31–Nov. 3, 1994, Boston, MA, pp. 280–281.

Chua, C. L. et al., "Low–Threshold 1.57-µm VC-SEL's Using Strain–Compensated Quantum Wells and Oxide/Metal Backmirror", IEEE Photonics Technology Letters, vol. 7, No. 5, May 1995, pp. 444–446.

(List continued on next page.)

Primary Examiner—Rodney B. Bovernick
Assistant Examiner—Robert McNutt
Attorney, Agent, or Firm—Jones, Tullar & Cooper, P.C.

[57] ABSTRACT

Grating-coupled surface emitting laser structures utilize strain-compensated multiple quantum wells as the laser gain medium, and are used in combination with a very high grating coupling efficiency to reduce both output beam spot size and overall device size. The lasers are designed with grating coupling coefficients that are much higher (e.g., greater than 150 cm$^{-1}$) than those employed in conventional grating coupled lasers to achieve a substantial increase in the laser energy coupled vertically through the top surface of the laser. This permits a substantial reduction of the output laser beam size so that it can be easily matched to multimode, and even single mode optical fibers. The use of the very high coupling coefficient is made possible because of the substantially increased optical gain provided by the strain-compensated multiple quantum well structure which offsets the substantially increased optical losses that are induced in the horizontal laser cavity by the increased grating coupling efficiency. Preferably, the increased coupling efficiency is achieved by moving the quantum well structure close to the surface gratings employed for the grating coupling, and increasing the refractive index difference between the grating material and a transparent electrode covering the gratings.

19 Claims, 2 Drawing Sheets

OTHER PUBLICATIONS

Kasukawa, A. et al., "Very low threshold current density 1.5 µm GaInAs/AlGaInAs graded-index . . . organometallic chemical vapor deposition", Appl. Phys. Lett., vol. 59, No. 20, 11 Nov. 1991, pp. 2486–2488.

Babic, D. I. et al., "Double-fused 1.52-µm vertical-cavity lasers", LEOS 1994 Proceedings, Nov. 3, 1994, pp. 1–2.

Babic, D. I. et al., "Double-fused 1.52-µm vertical-cavity lasers", Appl. Phys. Lett 66(9), 27 Feb. 1995, pp. 1030–1032.

Briggs, A. T. R. et al., "Gain and Threshold Characteristics of Strain-Compensated Multiple-Quantum-Well Lasers", IEEE Photonics Technology Letters, vol. 4, No. 5, May 1992, pp. 423–425.

Lin, C. H. et al., "On nonuniform pumping for multiple-quantum well semi-conductor lasers", Appl. Phys. Lett 65(19), 7 Nov. 1994, pp. 2383–2385.

Lin, C. H. et al., "Effects of Transport Limited Nonuniform Pumping for Multiple Quantum Well Semiconductor Lasers", LEOS 1994 Proceedings, Oct. 31–Nov. 3, 1994, Boston, MA, pp. 121–122.

Lin, C. H. et al., "Photopumped long wavelength vertical-cavity surface-emitting lasers using strain-compensated multiple quantum wells", Appl. Phys. Lett. 64(25)1994, 3 pages (Jun. 1994) pp. 3395–3397.

Miller, B. I. et al., "Strain-compensated strain-layer superlattices for 1.5 µm wavelength lasers", Appl. Phys. Lett. 58(18), 6 May 1991, pp. 1952–1954.

Seltzer, C. P. et al., "Zero-Net-Strain Multiquantum Well Lasers", Electronics Letters, 4 Jul. 1991, vol. 27, No. 14, pp. 1268–1270.

Uchida, T. et al., "CBE Grown 1.5 µm GaIn-AsP-InP Surface Emitting Lasers", IEEE Journal of Quantum Electronics, vol. 29, No. 6, Jun. 1993, pp. 1975–1980.

Uomi, K. et al., "Low Threshold, Room Temperature Pulsed Operation, of 1.5 µm Vertical-Cavity . . . Multi-Quantum Well Active Layer", IEEE Photonics Technology Letters, vol. 6, No. 3, Mar. 1994, pp. 317–319.

STRAIN-COMPENSATED MULTIPLE QUANTUM WELL LASER STRUCTURES

CROSS REFERENCE TO RELATED APPLICATION

This application is related to application Ser. No. 08/238,500, which was filed on May 5, 1994, now U.S. Pat. No. 5,491,710.

BACKGROUND OF THE INVENTION

The present invention relates in general to semiconductor laser structures which incorporate strain-compensated multiple quantum wells as the laser gain medium.

High speed surface emitting lasers (SELs) are useful in optical communications, optical interconnects and many military applications. One very attractive method of making surface emitting lasers is to use the mechanism of surface grating coupling. The distributed feedback (DFB) laser and the distributed Bragg reflected (DBR) laser are two examples of such lasers which employ first or second order gratings to couple laser light from a horizontal cavity vertically through a horizontal surface of the laser. When a guided light wave "sees" second order gratings (a portion of the optical field of the light wave intersects the gratings), the light will simultaneously experience both a reflection in the opposite direction and diffraction normal to its propagation axis. The reflection can be used to create the optical feedback required for a laser diode, while the diffractions can be used for surface emission. First order gratings are often employed in combination with the second order gratings because the first order grating is more efficient in reflecting the light than is the second order grating. However, the first order grating does not produce surface coupling. Therefore, it is sometimes favorable to combine first order gratings with second order gratings to achieve both efficient feedback and surface coupling.

DFB lasers have their grating regions extended along almost the entire laser cavity, while DBR lasers have their grating regions formed at the ends of the laser body. The gratings of DFB lasers are normally located below and above the laser's active region, so that light created by the active region "sees" the gratings immediately. In contrast, light generated in the active region of a DBR laser "sees" no gratings until near the ends of the laser body, and there is no active layer in the grating region. The characteristics of DFB and DBR lasers are in many ways comparable except for some subtle differences.

DFB lasers are currently more popular and more successful commercially because their fabrication process, though expensive and complicated, is not as expensive and complicated as that of DBR lasers. The key to reducing their cost is to simplify the fabrication and packaging costs. The former involves the improvement of device process, testing, throughput and yield, while the latter involves simpler optical alignment and assembly. Since surface emitting lasers can be batch fabricated, on-wafer tested and are much more easily adapted for device/optical fiber coupling, grating coupled surface emitting lasers have long been considered as a promising candidate for low cost DBR/DFB type lasers. However, several problems remain that limit the use of grating coupled DFB/DBR lasers in commercial applications.

For DBR type grating coupled surface emitting lasers, there is a trade off between coupling efficiency and laser performance. If one wants to achieve high performance (e.g., low threshold current), the DBR mirror is preferably formed with both first and second order gratings so that the reflectivity can be made high. This results in a lower power output since the light intensity decays quickly in the first order gratings and not much light can be coupled vertically through the laser's top surface by the second order gratings. On the other hand, if second order gratings are connected directly to the gain region, the mirror loss will be too high to achieve a low threshold current. In both configurations, the output intensity is an one-sided exponential decay function that does not match the mode field of the optical fiber to which the laser is coupled, thereby leading to a low coupling efficiency.

For DFB lasers having second order gratings at the center or throughout the entire laser cavity, the output beam spot in the laser axis will be hundreds of microns long, and the net output power in the surface normal direction will be very low. This is because the surface coupling has to be weak or the device will suffer from high coupling and scattering loss. It should be noted that surface coupling can be considered as optical loss since it removes photons from the laser cavity. The exceedingly large laser beam spot size, in spite of its narrow diffraction angle, makes the optical coupling to single mode fibers difficult without sophisticated lenses. Finally, because of the weak reflective and surface coupling by first or second order gratings, the overall device size cannot be made smaller than a few hundred microns, and this limits the device fabrication throughput.

The parameter that characterizes the coupling strength or efficiency of the grating is the coupling coefficient, called $\kappa$. This parameter is in turn dependent on a number of other parameters. For example, $\kappa$ increases as the difference in refractive indices between the materials employed on both sides of the grating increases. $\kappa$ increases also with increases in the overlap between the optical field created by the laser gain medium and the grating region. On the other hand, increases in the distance between the gratings and the active region of the laser cause corresponding decreases in the coupling coefficient. For example, in situations where the active regions are far away from the grating region, photons can hardly "see" the gratings, and $\kappa$ will remain low even if the grating is created between materials of large refractive index difference.

In all known DFB and DBR grating coupled laser structures, the value of $\kappa$ is almost always in the range of 50–100 $cm^{-1}$. This is because any attempt of achieving a coupling coefficient significantly higher than 100 $cm^{-1}$ (e.g., greater than 150 $cm^{-1}$) will severely jeopardize the laser performance or even render the devices inoperable since the resulting optical loss caused by the strong grating coupling will be higher than the maximum optical gain which the active region can produce. This limit on the maximum value of the coupling coefficient also limits the smallest size of the device, which in turn limits device fabrication throughput by limiting the number of devices that can be formed on each wafer. With present grating coupled lasers, it is also not possible to reduce the output beam spot size to a size which matches the mode field of single mode optical fibers.

SUMMARY OF THE INVENTION

In view of the foregoing, it is the object of the present invention to provide grating coupled surface emitting laser (SEL) structures which overcome the size limitations of prior art structures. This is achieved by providing laser structures which employ increased optical gain in combination with increased grating coupling efficiency.

To increase the optical gain substantially, the present invention makes use of a gain medium comprising a plurality of strained quantum wells. It is known that the optical gain for strained quantum wells is substantially higher than that of unstrained quantum wells. However, it has not been possible before to employ such strained quantum wells in grating coupled surface emitting lasers because of the critical thickness constraint. The critical thickness is defined as the thickness above which dislocations and other defects will form between the layers of quantum wells, and these defects must be avoided in surface emitting laser structures. Unfortunately, grating coupled surface emitting lasers require a relatively thick gain medium to compensate for optical losses that result when the grating coupling efficiency is increased. If a thick gain medium is used, the optical losses are spread out over the thickness of the gain medium so that the resulting effective optical loss is reduced to an acceptable level. This required thickness of the gain medium dictates that a large number of strained quantum wells, far above the critical thickness, are required to achieve lasing.

To solve this problem, the present invention employs multiple strained quantum wells which are strain-compensated, thereby lifting the critical thickness constraint and permitting the use of the requisite number of quantum wells. Each of the strain-compensated quantum wells actually comprises a quantum well layer and a barrier layer. The quantum well layer is strained, for example, by applying a compressive force thereto, while the adjacent barrier layer is placed in tension with an opposite and preferably equal force so that it cancels most or all of the compressive strain imparted on the quantum well. This results in the pair of layers having a zero or near zero net strain. In this manner, a plurality of the strained quantum well-barrier layer pairs can be stacked on one another with very little or no strain buildup.

The thickness of the gain medium created by stacking a plurality of the quantum well/barrier layer pairs reduces the effective optical loss of the resulting laser structure. In addition, the strained quantum wells provide a substantially high optical gain which further overcomes the optical losses, as well as the high cavity losses. To further enhance the gain so that the threshold current of the resulting device remains low even with a relatively high optical loss, the quantum wells can also be p-doped. P-doping further raises the gain and differential gain. This is important because with a large number of strained quantum wells, hole transport becomes a problem because they have trouble getting through the wells, and p-doping facilitates the hole transport.

In the preferred embodiments of the present invention, the use of strongly coupled, high loss gratings is made possible by the high gain of the strain-compensated multiple quantum well gain medium. In particular, the preferred embodiments of the invention employ a grating coupling coefficient that is greater than 150 $cm^{-1}$, and preferably is on the order of 400 $cm^{-1}$ or greater. This is accomplished primarily by moving the strain-compensated multiple quantum well structure closer to the gratings formed on or near the output surface of the device. Specifically, the distance between the top of the quantum well structure and the bottom of the grating or gratings is reduced below 500 nm, and preferably less than 300 nm, which is substantially smaller than is employed in conventional grating coupled surface emitting lasers. This greatly increases the coupling coefficient due to the substantial increase in the amount of overlap between the optical field generated by the laser gain medium (quantum well structure) and the grating regions. The preferred embodiments of the present invention also employ an electrode layer which is formed on top of the grating regions, and has a very low index of refraction on the order of approximately 2.5 or less. Since the semiconductor materials which are employed to form the laser body, including the grating regions, typically have an index of refraction on the order of 3 or greater, the use of the low index material for the electrode further increases the grating coupling coefficient by increasing the difference in refractive indices between the gratings and the electrode to greater than approximately 0.5.

Using the foregoing techniques, the preferred embodiments of the present invention have coupling coefficients as high as 400 $cm^{-1}$ in second order grating devices, and as high as 1000 $cm^{-1}$ in first order grating devices. Although previous grating coupled surface emitting lasers having coupling coefficients this high would not even be operable, the use of the strain-compensated multiple quantum well structure in the active region in the present invention results in a high enough optical gain that operable threshold current levels can easily be achieved, in spite of the very high coupling coefficients.

The principal benefit of the present invention is that use of the very high coupling coefficient permits formation of a very small laser beam spot size since so much of the laser energy is being coupled through the output surface. This permits matching of the output beam to the mode field of very small diameter (e.g., 10 μm) single mode optical fibers which are currently in use in optical communications. In addition, the overall size of the laser structures themselves can be made smaller, because the required length of the horizontal laser cavity is inversely proportional to the coupling coefficient. As a result, more devices can be formed on a single wafer, which thus increases fabrication throughput.

BRIEF DESCRIPTION OF THE DRAWINGS

The features and advantages of the present invention will become apparent from the following detailed description of a number of preferred embodiments thereof, taken in conjunction with the accompanying drawings, in which.

DETAILED DESCRIPTION OF THE PREFERRED EMBODIMENTS

Figure 1:
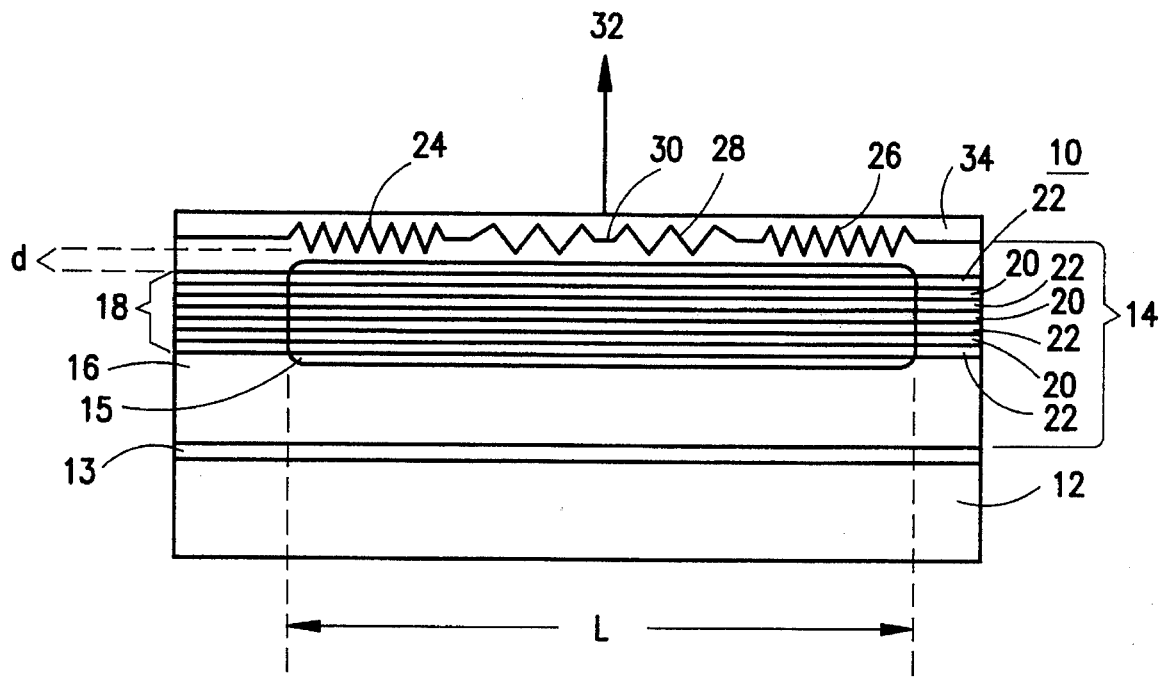
FIG. 1 is a schematic side view of a grating coupled surface emitting laser constructed in accordance with the first preferred embodiment of the present invention.

A number of key concepts will first be explained before a detailed consideration of the preferred embodiments of the present invention and variations thereon will be described. It is well known that strained quantum wells have a much higher optical gain than unstrained quantum wells and bulk semiconductor material. However, only a few strained quantum wells can be grown due to the critical thickness constraint. This is because each time another strained quantum well layer is added to one or more additional strained quantum well layers, the overall strain imparted to the resulting layered structure increases. The critical thickness of the structure is defined to be the thickness above which the strain becomes so great that misfit dislocations and other defects are formed between the layers, thereby making the structure unusable, especially for optical purposes.

The critical thickness constraint causes a low confinement factor for in-plane lasers, such as grating coupled surface emitting lasers (SELs). However, the critical thickness constraint does not apply to strain-compensated multiple quantum wells because the strain in each well is balanced by an opposite strain in an adjacent barrier layer. As a result, the strain-compensated multiple quantum well structure creates both high gain and high confinement factor for in-plane lasers.

If a high gain strain-compensated multiple quantum well structure is employed as the active medium for a grating coupled SEL, the coupling efficiency between the quantum well structure and the grating can be increased substantially because the high gain of the quantum well structure can be used to compensate for the optical losses that are created in the laser cavity when the coupling efficiency is increased. The key parameter that characterizes the coupling efficiency of the grating is called the coupling coefficient, $\kappa$, where $$\kappa = \frac{k_o^2}{2\beta} \frac{\int E^*(x,y)\Delta\epsilon_m(x,y)E(x,y)dxdy}{\int E^*(x,y)E(x,y)dxdy} \quad (1)$$

where E is the electric field, $k_o=2\pi/\lambda$, $\beta$ is the wavevector of the field, and m is 1 for first order grating and 2 for second order grating. $\Delta\epsilon m$ is the mth Fourier component of the dielectric function in the grating region defined as $$\epsilon(x,y,z) = \epsilon(x,y) + \Delta\epsilon(x,y,z) \quad (2)$$

and $$\Delta\epsilon(x,y,z) = \sum_{m\neq 0} \Delta\epsilon_m(x,y)\exp[i(2\pi/\Lambda)mz] \quad (3)$$

where $\Lambda$ is the pitch of the grating.

In Equations (1)–(3), the y coordinate is along the vertical output direction of the laser, the z coordinate is along the direction of the horizontal laser cavity and the x axis in the horizontal direction perpendicular to the direction of the horizontal cavity.

A number of factors thus influence the value of $\kappa$. For example, if the difference in refractive index between the two materials employed on either side of the grating is increased, $\kappa$ also is increased. In addition, $\kappa$ increases with the strong overlap between the optical field and the gratings. Conversely, if the distance between the active region of the laser and the coupling gratings is increased, $\kappa$ is decreased because photons in the active region can hardly "see" the gratings.

In all of the preferred embodiments of the present invention, the value of the coupling coefficient $\kappa$ is chosen to be at least greater than approximately 150 cm$^{-1}$, and preferably greater than 400 cm$^{-1}$. The very high gain of the strain-compensated multiple quantum well structure permits use of a coupling coefficient this high. As a result of this high coupling coefficient, the output laser beam can be easily matched to either a single mode optical fiber, or a multimode optical fiber. In addition, it is generally known in the art that the length of the horizontal laser cavity in a grating-coupled SEL is inversely proportional to the coupling coefficient, and is preferably equal to 2/$\kappa$. Since $\kappa$ is increased in the present invention approximately fivefold over that of conventional grating-coupled SELs, the length of the horizontal laser cavity can accordingly be reduced fivefold. It is thus possible employing the designs of the present invention to make a laser with a horizontal cavity length of less than 50 µm, and as small as 10 µm. Although the actual die size of the final device is limited by the size of its bonding pads, a threefold increase in the number of devices per wafer could be realized by this size reduction, and this in turn increases fabrication throughput by a factor of three.

Turning now to FIG. 1, a first preferred embodiment of the present invention as illustrated. In particular, a grating-coupled SEL 10 is shown which includes a semiconductor substrate 12, which is preferably formed from InP. Other materials for the substrate 12 can be employed, depending upon the operating wavelength of the SEL 10, and the fabrication process employed. InP is employed for long wavelength lasers of either 1.3 or 1.55 µm. For very long wavelengths in the infrared region, e.g. 2.0–5.0 µm, the substrate 12 is preferably made from InAs. On the other hand, for very short wavelengths of less than 0.5 µm, ZnSe or GaP are used in the substrate 12.

A number of layers are formed on the substrate 12. These include an n-type contact layer 13 on which is formed a laser body 14. Formed in the laser body 14 is a horizontal laser cavity 15 for the SEL 10. Incorporated in the horizontal laser cavity 15 is a first injection layer 16, which can be formed from n-type InP or InGaAsP; a strain-compensated multiple quantum well structure 18 including a plurality of quantum well layers 20 which alternate with a plurality of barrier layers 22; and a second injection layer 23, which can be formed from p-type InP or InGaAsP.

The multiple quantum well structure 18 is fabricated using any conventional known technique so that compressive (or tensive) strain is imparted to each of the quantum well layers 20, while an opposite and preferably equal tensive (or compressive) strain is imparted to each of the barrier layers 22 so that the net overall strain imparted to the multiple quantum well structure 18 is zero or nearly zero. As a result, the multiple quantum well structure 18 can be formed with any desired number of the quantum well layers 20, regardless of the critical thickness constraint. In the preferred embodiment of the present invention, between 7 and 15, preferably 12, of the quantum well layers 20 are provided in the multiple quantum well structure 18 along with an approximately equal number of the barrier layers 22. Each of the quantum well layers 20 has a thickness of approximately 75 angstroms, while each of the barrier layers 22 has a thickness of approximately 150 angstroms so that the total thickness of each well/barrier layer pair is approximately 225 angstroms, and the total thickness of the multiple quantum well structure 18 is approximately between 0.15 and 0.35 µm.

Preferably, the quantum well layers 20 are made of InGaAs, InGaAsP, InGaAlAs or any other compounds suitable for use on InP substrates, while the barrier layers 22 are formed from InGaAsP or InAlGaAs. Although the strain imparted to the quantum wells 20 greatly improves the resulting optical gain of the SEL 10, each of the quantum well layers 20 are also preferably p-doped with a doping concentration of approximately 1–3×10$^{12}$ cm$^{-2}$ for each quantum well layer to further enhance the gain and the differential gain. Preferably, the doping concentration is nonuniform across the quantum well layers to facilitate hole transport. As a result, an optical gain above 10,000 cm$^{-1}$ can be achieved at a relatively low carrier concentration. Because of the low carrier concentration, the Auger recombinations will not be the dominant factor for the threshold current and the SEL 10 can operate efficiently at long wavelengths. The increased differential gain also enables the SEL 10 to be operated at very high speeds, e.g., in excess of 30 GHz.

Formed on top of, or alternatively slightly embedded in, the laser body 14, are first and second first order diffraction gratings 24 and 26, and a second order diffraction grating 28. An optional, phase shift region 30 can be formed in the center of the second order diffraction grating 28 if desired for the reasons discussed below.

The first and second first order diffraction gratings 24 and 26 are employed to define the horizontal cavity length L of the SEL 10, and are positioned at the ends of the horizontal cavity 15 to improve efficiency of the optical feedback which causes the laser light to travel back and forth in the horizontal cavity 15. The second order diffraction grating 28 is employed only for vertical coupling of the laser light from the horizontal cavity 15 through the top surface of the SEL 10 as a vertically emitted output laser beam 32. The optional phase shift region 30, where the spacing of the individual gratings in the second order diffraction grating 28 is altered, is provided to cancel out one of two degenerate light wavelengths for single mode operation of the SEL 10, and also to enhance output intensity. The phase shift region 30 creates a nonuniform light intensity profile that is peaked at the phase shifted region, and thus improves power efficiency of the SEL 10.

Since the second order diffraction grating 28 also causes reflection of horizontally traveling laser light in the opposite direction in addition to providing diffraction perpendicular to the light's propagation axis, the second order diffraction grating 28 can also be employed to define the length L of the horizontal cavity 15 if desired. However, the use of the first order gratings 24 and 26 is preferred for this purpose because the first order gratings are more efficient at causing the horizontal reflection than is the second order grating 28. For fabrication simplicity, however, all three of the gratings 24, 26 and 28 could be made as a single large second order diffraction grating if desired.

To provide current injection into the strain-compensated multiple quantum well structure 18, a transparent electrode 34 is formed on top of the laser body 14 and the diffraction gratings 24, 26 and 28 formed therein. To increase the coupling efficiency of the diffraction gratings 24, 26 and 28, the transparent electrode 34 is preferably formed from a material, such as ITO, which has a low index of refraction, preferably lower than 2.5. As discussed previously, the coupling coefficient $\kappa$ increases as the difference in refractive indices increases between the material in which the diffraction gratings are formed, and the material into which the emitted laser beam 32 travels from the diffraction gratings. This difference is thus the difference between the refractive index of the laser body 14 and the refractive index of the transparent electrode 34. Since the laser body 14 must be formed from a semiconductor material, such as InP, and such materials have refractive indices generally greater than 3, use of a material having a refractive index less than approximately 2.5, such as ITO, in the transparent electrode 34, helps increase the coupling coefficient by increasing the refractive index difference between the laser body 14 and the electrode 34 to greater than approximately 0.5.

To increase the value of the coupling coefficient $\kappa$ further, the vertical distance d between the top of the strain-compensated multiple quantum well structure 18 and the bottom most portions (downwardly facing tips) of the diffraction gratings 24, 26 and 28, is chosen to be less than approximately 500 nm, and is preferably on the order of approximately 200–300 nm. With these parameter values, and employing Equation (1) to determine the coupling coefficient $\kappa$, the SEL 10 is determined to have a value of $\kappa$ greater than or equal to approximately 400 $cm^{-1}$ in the region beneath the second order diffraction grating 28, and greater than or equal to approximately 600 $cm^{-1}$ in the regions beneath the first order diffraction gratings 24 and 26. These values provide a tremendous increase in the energy level of the output laser beam 32. One advantage to this is that the diameter of the output beam 32 can then be made small enough, e.g., on the order of 10 microns, so that it can be easily matched to a single mode optical fiber of approximately the same diameter. At the same time, the high coupling coefficient permits a corresponding reduction in the length L of the horizontal laser cavity 15, and for example can be easily as small as 50 µm for a value of $\kappa$=400 using the preferred relationship of $\kappa L>1$.

Figure 2:
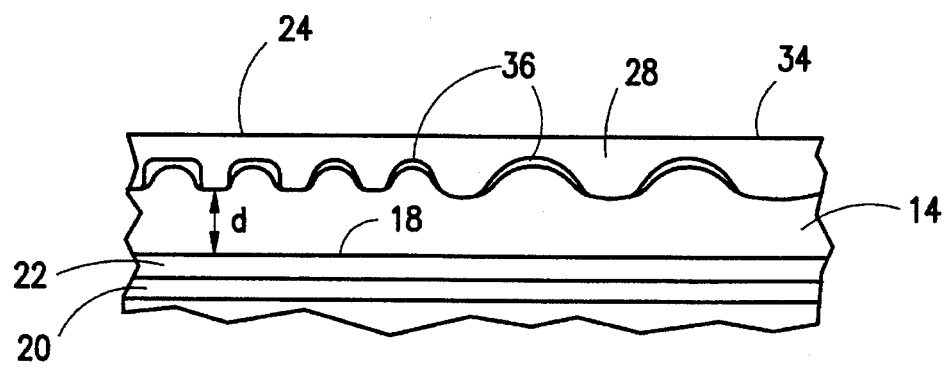
FIG. 2 is a partial cut-away schematic side view of a modification of the laser of FIG. 1.

In the variation illustrated in FIG. 2, the SEL 10 is modified to employ the concept of loss or gain grating in addition to normal index grating. For all semiconductor lasers, the refractive index is a complex number resulting from material gain or loss. Thus, the index difference between the grating materials can be in the real part, the imaginary part or both parts of the index value. Normally, index difference in the real part is easier to create and its magnitude is higher, so that most conventional DFB lasers rely on real index grating for optical feedback. However, theories and experiments have shown that DFB lasers with loss/gain grating (those based on the imaginary part of the index value) have a high single mode device yield, better spectral stability and less sensitivity to residue reflections.

In FIG. 2, the SEL 10 has therefore been modified to take advantage of these considerations. In particular, the SEL 10 has been modified in FIG. 2 to use both real index grating and loss/gain (imaginary) index grating. The loss grating is produced by a thin (preferably approximately 50 nm or less) absorption layer 36 formed on selected portions of the diffraction gratings 24, 26 and 28. The absorption layer 36 can be formed of any suitable medium, such as InGaAs, quantum wells, other compound semiconductors, metal or dielectric material such as TiN, for example. In FIG. 2, the absorption layer 36 is illustrated as being formed only over the upper peaks of the diffraction gratings. Alternatively, the absorption layer segments could be phase shifted so that they cover only the "valleys" of the diffraction gratings. Further, although the absorption layer 36 is illustrated in FIG. 2 as being formed on top of the diffraction gratings, it could also be embedded within the gratings if desired.

Figure 3:
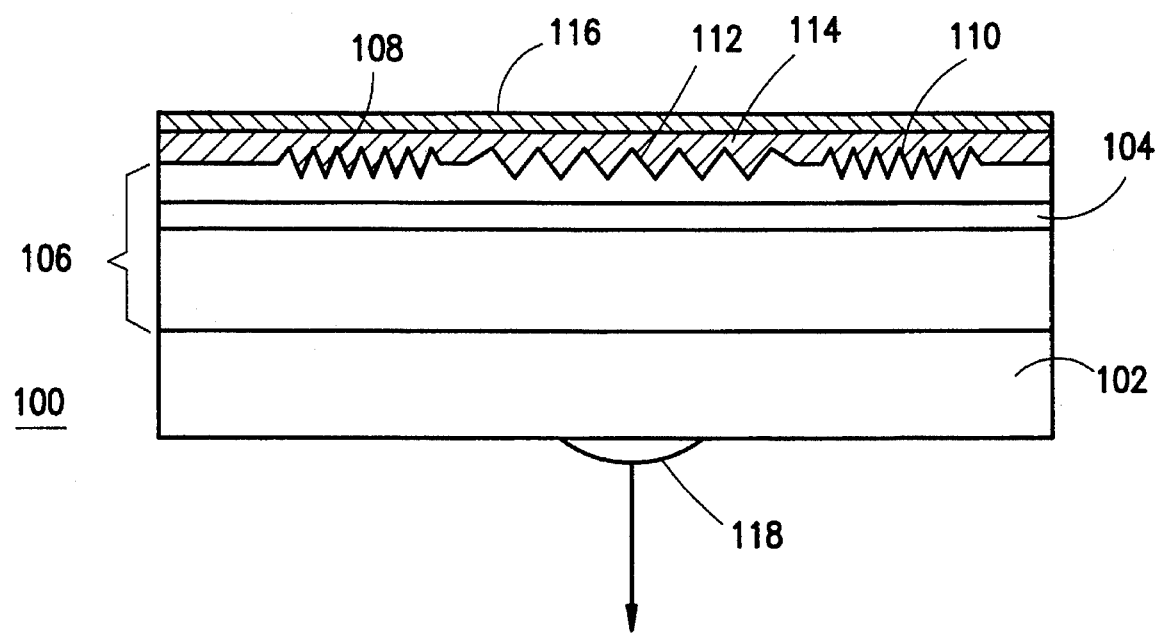
FIG. 3 is a schematic side view of a grating coupled surface emitting laser constructed in accordance with a second preferred embodiment of the present invention.

Turning now to FIG. 3, another alternative embodiment of the present invention is illustrated comprising a grating-coupled SEL 100 which provides surface emission of laser light from the back side of the device substrate. The structure of the SEL 100 is substantially similar to that of the SEL 10 illustrated in FIG. 1, and thus includes a semiconductor substrate 102, a strain-compensated multiple quantum well structure 104 formed in a laser body 106, first and second first order diffraction gratings 108 and 110, a second order diffraction grating 112 and an electrode 114. The principal difference between the SEL 10 and the SEL 100 is that the SEL 100 is arranged to couple the laser light in the opposite vertical direction through the back side of the substrate 102. It should be noted that since the semiconductor substrate 102 is transparent for long wavelength light, it will not block its emission. To achieve this operation, the electrode 114, which again is preferably formed from a low index of refraction transparent material, such as ITO, has a thin reflective coating 116 formed thereon which reflects the vertically coupled laser light in the downward direction. Alternatively, the electrode 114 can be itself made from a reflective metal.

The embodiment illustrated in FIG. 3 provides a number of advantages over the embodiment of FIG. 1. First, the electrode 114 can be employed for front surface contact without concern about light blocking. Second, the laser junction formed within the SEL 100 can be mounted very close to a metal heat sink when the SEL 100 is mounted top surface down, and this will provide superior thermal conductance. Third, an optical lens 118 can be easily integrated on the substrate side of the SEL 100 to further improve the light coupling efficiency to the optical fiber. Finally, since reflective layer 116 reflects any light emitted toward it back toward the substrate 102, the power efficiency of the SEL 100 is nearly doubled over that of the embodiment illustrated in FIG. 1.

In summary, the present invention provides novel grating-coupled SELs which, through use of a high gain medium and a high grating coupling coefficient, can be employed for interfacing to very small diameter single mode fibers. In addition, the resulting devices can be made much smaller than previous devices, thereby increasing fabrication throughput.

Although the present invention has been described in terms of a number of preferred embodiments, it will be understood that numerous other modifications and variations could be made thereto without departing from the scope of the invention as set forth in the following claims. For example, although each of the preferred embodiments of the present invention illustrated in FIGS. 1–3 comprise DFB laser structures due to their somewhat simpler fabrication process, it will be understood that the inventive concepts can be applied to any type of grating coupled SELs, including the more complicated DBR types.

What is claimed is:

1. A grating coupled surface emitting laser structure comprising:

a) a substrate;

b) a laser body on said substrate;

c) a horizontal laser cavity in said laser body;

d) a strain-compensated multiple quantum well structure in said horizontal cavity; and e) a second order diffraction grating spaced above said strain-compensated multiple quantum well structure, wherein the coupling efficiency between said horizontal laser cavity and said second order diffraction grating is selected to be greater than approximately 150 cm$^{-1}$.

2. The laser structure of claim 1, wherein a top most portion of said strain-compensated multiple quantum well structure is spaced less than approximately 500 nm from a bottom most portion of said second order diffraction grating.

3. The laser structure of claim 2, wherein said top most portion of said strain-compensated multiple quantum well structure is spaced approximately 200–300 nm from said bottom most portion of said second order diffraction grating.

4. The laser structure of claim 1, wherein the coupling efficiency between said horizontal laser cavity and said second order diffraction grating is selected to be greater than approximately 400 cm$^{-1}$.

5. The laser structure of claim 4, wherein said horizontal laser cavity has a length of less than approximately 50 μm.

6. The laser structure of claim 1, wherein said horizontal laser cavity has a length of less than approximately 50 μm.

7. The laser structure of claim 1, further comprising first and second first order diffraction gratings spaced above said strain-compensated multiple quantum well structure, and defining first and second ends, respectively, of said horizontal laser cavity.

8. The laser structure of claim 7, wherein the coupling efficiency between said horizontal laser cavity and said second order diffraction grating is selected to be at least approximately 400 cm$^{-1}$, and the coupling efficiency between said horizontal laser cavity and said first and second first order diffraction gratings is selected to be at least approximately 600 cm$^{-1}$.

9. The laser structure of claim 1, further comprising a transparent electrode on said laser body.

10. The laser structure of claim 9, wherein said laser body has a refractive index which is at least 0.5 greater than a refractive index of said transparent electrode.

11. The laser structure of claim 10, wherein said transparent electrode has a refractive index less than approximately 2.5, and said laser body has a refractive index greater than approximately 3.0.

12. The laser structure of claim 9, further comprising a reflective-coating on said transparent electrode for reflecting laser light through a bottom surface of said substrate.

13. The laser structure of claim 12, further comprising a lens disposed on said bottom surface of said substrate for improving the light coupling efficiency between said laser structure and an optical fiber to be interfaced thereto.

14. The laser structure of claim 1, further comprising a reflective layer positioned above said refraction grating for reflecting laser light through a bottom surface of said substrate.

15. The laser-structure of claim 1, further comprising means for causing said laser structure to operate in a single mode.

16. The laser structure of claim 15, wherein said means for causing said laser structure to operate in a single mode comprises a phase shift region formed in said second order diffraction grating for cancelling one of two degenerate light wavelengths.

17. The laser structure of claim 1, further comprising a loss grating on said diffraction grating.

18. The laser structure of claim 17, wherein said loss grating is formed from an absorption layer having a thickness of no greater than approximately 50 nm.

19. The laser structure of claim 1, wherein said strain-compensated multiple quantum well structure is formed from semiconductor material which is P-doped to increase the optical gain of said laser structure.

* * * * *